United States Patent
Dong et al.

(10) Patent No.: US 6,187,633 B1
(45) Date of Patent: Feb. 13, 2001

(54) METHOD OF MANUFACTURING A GATE STRUCTURE FOR A SEMICONDUCTOR MEMORY DEVICE WITH IMPROVED BREAKDOWN VOLTAGE AND LEAKAGE RATE

(75) Inventors: Zhong Dong; Joe Hui; Anqing Zhang, all of Singapore (SG)

(73) Assignee: Chartered Semiconductor Manufacturing, Ltd., Singapore (SG)

( * ) Notice: Under 35 U.S.C. 154(b), the term of this patent shall be extended for 0 days.

(21) Appl. No.: 09/169,437

(22) Filed: Oct. 9, 1998

(51) Int. Cl.[7] .............................................. H01L 21/8247
(52) U.S. Cl. ................................................ 438/261; 438/591
(58) Field of Search .................................. 438/261, 591, 438/954, 791, 287, 592, 238; 257/640, 649, 324, 316, 315, 325, 769, 770, 775, 776, 786

(56) References Cited

U.S. PATENT DOCUMENTS

| | | | |
|---|---|---|---|
| 5,407,870 | 4/1995 | Okada et al. | 437/241 |
| 5,427,967 | 6/1995 | Sadjadi et al. | 437/43 |
| 5,443,998 | 8/1995 | Meyer | 437/241 |
| 5,460,991 | * 10/1995 | Hong | 437/43 |
| 5,597,754 | 1/1997 | Lou et al. | 437/52 |
| 5,661,056 | 8/1997 | Takeuchi | 438/261 |
| 5,665,620 | 9/1997 | Nguyen et al. | 438/593 |

\* cited by examiner

Primary Examiner—Mary Wilczewski
Assistant Examiner—David Goodwin
(74) Attorney, Agent, or Firm—George O. Saile; Rosemary L. S. Pike; William J. Stoffel

(57) ABSTRACT

The invention is a method of manufacturing a semiconductor memory device using a novel intergate dielectric stack. A key feature of of the invention is the novel O/N/SiON/O structure, forming a silicon oxynitride layer on the silicon nitride layer. The method begins by forming a first insulating layer and a first conductive layer on a semiconductor substrate having one conductivity type. A second insulating layer is formed on the first conducting layer by sequentially stacking: a first silicon oxide layer; a silicon nitride layer; a silicon oxynitride layer; and a second silicon oxide layer. A second conductive layer is formed on the second insulating layer. The first insulating layer, the first conductive layer, the second insulating layer, and the second conductive layer are patterned to form a floating gate, an intergate dielectric, and a control gate. Finally, a source and drain are formed to complete the memory device.

16 Claims, 2 Drawing Sheets

METHOD OF MANUFACTURING A GATE STRUCTURE FOR A SEMICONDUCTOR MEMORY DEVICE WITH IMPROVED BREAKDOWN VOLTAGE AND LEAKAGE RATE

BACKGROUND OF THEE INVENTION

1. Field of the Invention

The present invention relates to a method of manufacturing a gate structure for a semiconductor memory device. More specifically the invention relates to a method for improving upon the electrical properties provided by an ONO intergate dielectric.

2. Discription of the Related Art

In conventional semiconductor memory devices an "ONO" dielectric film is used as an intergate having a stacking structure consisting of a silicon oxide film/a silicon nitride film/a silicon oxide film. The ONO structure provides good withstanding voltage and retention characteristic with a relatively thin film.

However, semiconductor device manufacturers are continually pressured to increase effective device densities in order to remain cost competitive. As the ONO dielectric film becomes thinner, pinholes and poor electrical qualities charateristic of nitride cause low breakdown voltages and leakage adversly affecting the reliability of the memory device.

Accordingly, a need exists for an intergate dielectric film for use in semiconductor memory devices that can provide higher withstanding voltage and retention characteristics as the film thickness is reduced.

The closest and apparently more relevant technical developments in the patent literature can be gleaned by considering the following patents.

U.S. Pat. No. 5,661,056 (Takeuchi) discloses oxynitride forme on the oxide layer of an NO and NON dielectric stacks.

U.S. Pat. No. 5,597,754 (Lou et al.), U.S. Pat. No. 5,427,967 (Sadjadi) and U.S. Pat. No. 5,665,620 (Nguyen) disclose methods to form ONO stacks.

U.S. Pat. No. 5,443,998 (Meyer) discloses a method of forming a chlorinated ONO stack.

U.S. Pat. No. 5,407,870 (Okada) discloses an oxynitride/oxide/oxynitride stack.

SUMMARY OF THE INVENTION

It is an object of the present invention to provide improved electrical properties (particularly withstanding voltage and leakage) over a conventional ONO stacked intergate dielectric layer.

It is another object of the present invention to provide a structure and a process for fabricating an improved semiconductor memory device gate having higher withstanding voltage and lower leakage than is provided by a conventional ONO stacked intergate dielectric layer of comparable thickness.

It is another object of the present invention to reduce or eliminate the pinhole problem found in the nitride layer of a conventional ONO stacked dielectric layer.

It is yet another object of the present invention to reduce the structural stress as compared to a conventional ONO stacked dielectric layer.

To acheive the above objects, the present invention provides a semiconductor memory device gate comprising: source and drain regions spaced apart from each other on a semiconductor substrate of one conductivity type and having a conductivity type opposite to the conductivity type of the semiconductor substrate; a tunnel oxide over a channel region between the source and drain regions; a floating gate electrode over the tunnel oxide; an intergate dielectric consisting of successive layers of silicon oxide, silicon nitride, silicon oxynitride and silicon oxide over the floating gate electrode; and a control gate electrode over the intergate dielectric.

Further, the present invention provides a method of manufacturing a semiconductor memory device gate. The method begins by forming a first insulating layer (12) on a semiconductor substrate (10) having one conductivity type. A first conductive layer (14) is formed on the first insulating layer (12). A second insulating layer is formed on the first conductive layer (14) by sequentially stacking: a first silicon oxide layer (16); a silicon nitride layer (18); a silicon oxynitride layer (20); and a second silicon oxide layer (22). A second conductive layer (24, 26 & 28) is formed on the second insulating layer (16, 18, 20 & 22). The first insulating layer (12) is patterned to form a tunnel oxide. The first conductive layer (14) is patterned to form a floating gate electrode. The second insulating layer (16, 18, 20 & 22) is patterned to form an intergate dielectric. The second conductive layer (24, 26 & 28) is patterned to form a control gate. Impurity ions are implanted into the semiconductor substrate (10) adjacent to the floating gate electrode (14) on both sides to form source and drain regions (30 & 32) having a conductivity type opposite to the conductivity type of the semiconductor substrate. A side insulating film is formed on the side surfaces of the floating gate electrode (14) and the control gate electrode (24, 26 & 28).

DETAILED DESCRIPTION OF THE PREFERRED EMBODIMENTS

Figure 1:
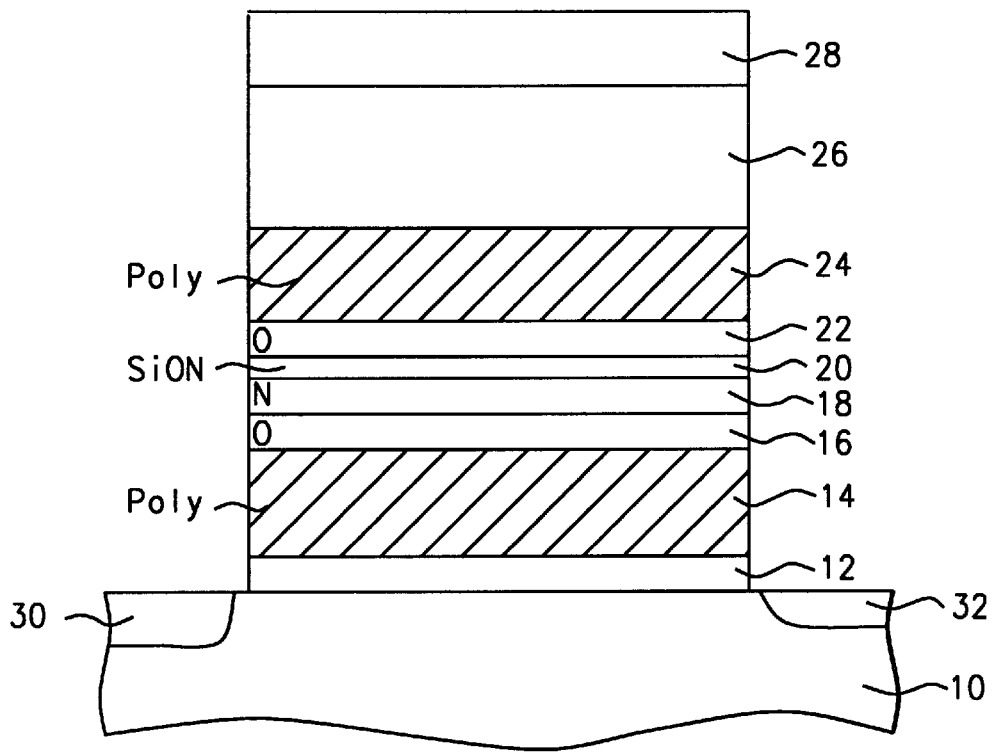
FIG. 1 is a cross-section illustrating the present invention.

Now in keeping with the objectives of the present invention, the method for forming a semiconductor memory device gate with an improved intergate dielectric is described in detail. The sequence of fabrication steps for a semiconductor memory device gate with an improved intergate dielectric is shown in FIG. 1. It should be noted that the drawings are in greatly simplified form. The process begins with a semiconductor substrate 10 as is well known in the art. The semiconductor substrate has preferably already undergone some processing such as isolation and well formation as are well known in the art.

As shown in FIG. 1, a first insulating layer 12 is formed on an active area. The first insulating layer 12 is preferably an oxide layer (tunnel oxide) which can be formed using a wet process in a water vapor atmosphere or a dry process in an oxygen atmosphere. Preferably, the first insulating layer 12 is grown in a dry process at a temperature in the range between 850° C. and 1050° C.; at a pressure in the range between 710 torr and 810 torr; for a time in the range between 10 minutes and 60 minutes; to a thickness in a range between 90 Å and 120 Å.

Also as shown in FIG. 1, a first conductive layer (e.g. polycrystalline silicon) 14 is formed over the first insulating layer 12. The first conductive layer 14 can be formed using a chemical vapor deposition (CVD) process by pyrolyzing silane at 575° C. to 650° C. at a pressure of 25 Pa to 130 Pa. Then, the first conductive layer 14 is preferably doped by implanting phosphorous ion into it.

Next, as shown in FIG. 1, a first silicon dioxide layer 16 is formed over the first conductive layer 14. The first silicon dioxide layer 16 can be formed using a CVD process by oxidizing silane with oxygen at 400° C. to 450° C. at atmospheric pressure or low pressure; by decomposing tetraethoxysilane (TEOS) at 650° C. to 750° C. at low pressure; by reacting dichlorosilane with nitrous oxide at 850° C. to 900° C. at low pressure; or most preferably by oxidizing polysilicon with $O_2$ at a temperature between 850° C. and 950° C. at atmospheric pressure. The first silicon dioxide layer preferably is formed to a thickness in the range between 30 Å and 100 Å.

Next, as shown in FIG. 1, a silicon nitride layer 18 is formed over the first silicon dioxode layer 16. The silicon nitride layer 18 can be formed using a CVD process by reacting silane and ammonia at atmospheric pressure and a temperature in a range between 700° C. and 900° C.; or most preferably by reacting dichlorosilane and ammonia at reduced pressure in the range between 25 Pa and 100 Pa and at a temperature in the range between 700° C. and 800° C. The silicon nitride layer 18 preferably is formed to a thickness in the range between 50 Å and 150 Å.

Figure 2:
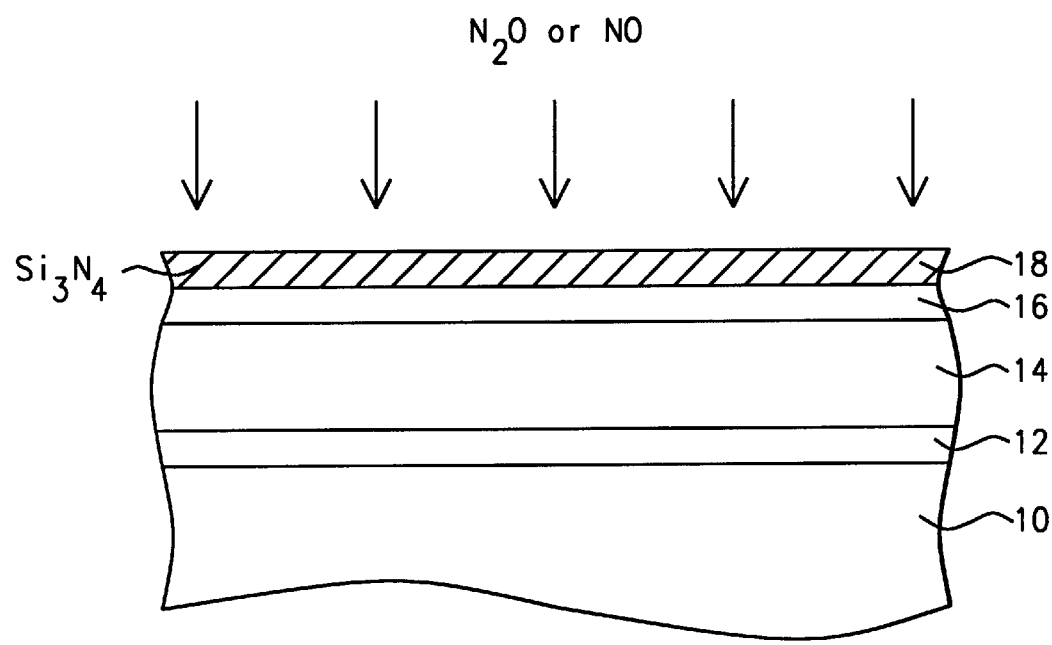
FIG. 2 is a cross section illustrating the key step of oxynitride formation of the present invention.

In a key step, as shown in FIG. 2, a thin silicon oxynitride layer 20 is formed at the top of the silicon nitride layer 18 by processing the silicon nitride layer 18 in a nitrogen containing gas such as NO or most preferably $N_2O$. The processing can be by furnace or most preferably by a Rapid Thermal Processing (RTP) of the silicon nitride layer 18. Preferably the $N_2O$ gas flows at a rate in the range between 1000 sccm and 10000 sccm, at a temperature in the range between 900° C. and 1100° C., at a pressure in the range between 10 kPa and 100 kPa, for a time in the range between 20 seconds and 180 seconds. The silicon oxynitride layer 20 preferably is formed to a thickness in the range between 5 Å and 30 Å.

Next, as shown in FIG. 1, a second silicon dioxide layer 22 is formed over the silicon oxynitride layer 20 using a CVD process or oxidation process as previously described. The second silicon dioxide layer 22 preferably is formed to a thickness in the range between 20 Å and 50 Å.

As shown on FIG. 1, a second conductive layer 24, 26, 28 is formed over the intergate dielectric layer: The conductive layer can consist of a first polysilicon sublayer 24, a tungsten silicide sublayer 26, and a polysilicon cap sublayer 28. The first polysilicon sublayer 24 and the polysilicon cap sublayer 28 can be formed using a CVD process by pyrolyzing silane at 575° C. to 650° C. at a pressure of 25 Pa to 130 Pa. The tungsten silicide sublayer 26 can be formed using a sputtering process or most preferably a thermal evaporation process as is well known in the art.

Finally, as shown in FIG. 1, the first insulating layer 12, the first conductive layer 14, the second insulating layer 16, 18, 20, 22, and the second conductive layer 24, 26, 28 are patterned to form a tunnel oxide, a floating gate, an intergate dielectric, and a control gate respectively using a photolithography process, as is well known in the art. Whereupon a source 30 and drain 32 are formed completing the memory devide.

Benefits

The present invention provides several advantages over the prior art. While the advantages of a traditional ONO stack (including manufacturability) are mantained, the present invention can reduce structural stress and eliminate pinholes by oxidizing the dangling bonds using oxygen from the decomposition of $N_2O$ or NO gas.

Figure 3:
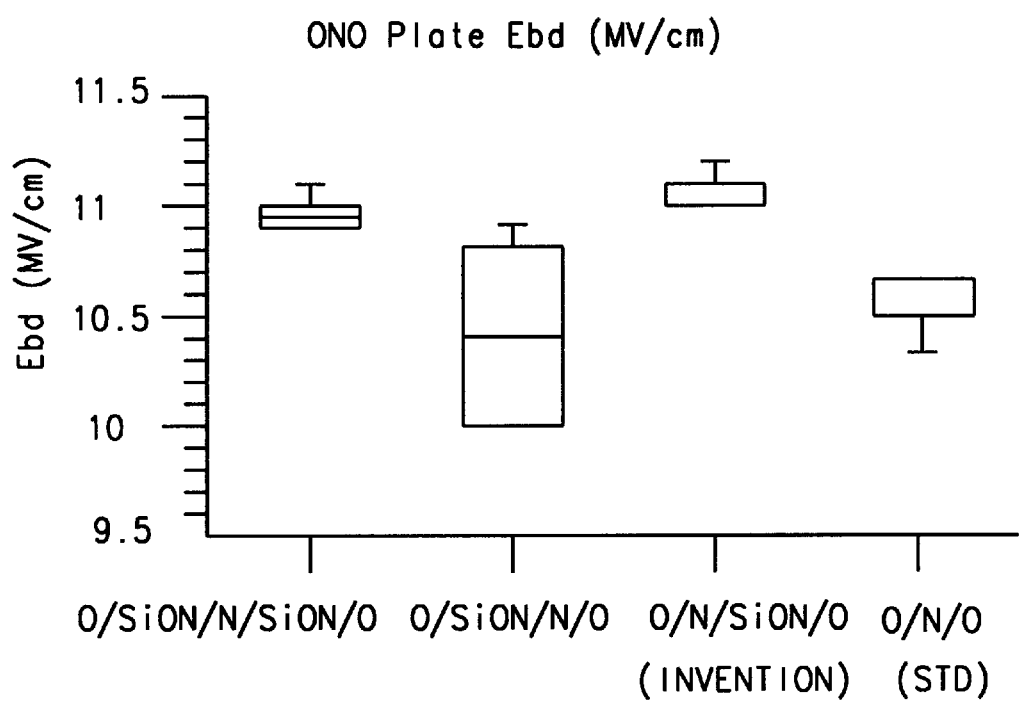
FIG. 3 illustrates experimental data comparing the present invention to a conventional ONO dielectric layer.

The present invention has been demonstrated to increase the withstanding voltage and decrease current leakage, thereby providing superior performance and making thickness scale down feasible. Devices were manufactured using the present invention (O/N/SiON/O), using a traditional ONO process and using two additional processes. The effective thickness was determined using a high frequency capacitance-voltage (HFCV) test as is well known in the art. Breakdown voltage ($V_{bd}$) was determined using a ramp voltage test to measure the voltage at which the current reached 1.0 micro-Amp. Electrical breakdown field ($E_{bd}$) was determined by deviding the $V_{bd}$ by the effective thickness. The test results are presented in FIG. 3.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing a semiconductor memory device comprising the steps of:
   a) forming a first insulating layer on a semiconductor substrate having one conductivity type;
   b) forming a first conductive layer on said first insulating layer;
   c) forming a second insulating layer by sequentially stacking:
      (i) a first silicon dioxide layer;
      (ii) a silicon nitride layer;
      (iii) a silicon oxynitride layer; and
      (iv) a second silicon dioxide layer;
      on said first conductive layer;
   d) forming a second conductive layer on said second insulating layer; and
   e) patterning said first insulating layer, said first conductive layer, said second insulating layer, and said second conductive layer to form a floating gate, an intergate dielectric layer, and a control gate.

2. The method of claim 1 wherein said silicon oxynitride layer is formed by rapid thermal processing said silicon nitride layer in a nitrogen containing gas at a temperature in the range between 900° C. and 1100° C.; at a pressure in the range between about 10 kPa and 100 kPa; for a period of time between 20 seconds and 180 seconds; wherein said silicon oxynitride layer has a thickness between 5 Å and 30 Å.

3. The method of claim 2 wherein said silicon oxynitride layer is formed by processing said silicon nitride layer in $N_2O$ gas.

4. The method of claim 1 wherein said silicon oxynitride layer is formed by processing said silicon nitride layer in NO gas.

5. A method of manufacturing a semiconductor memory device comprising the steps of:
   a) forming a first insulating layer on a semiconductor substrate having one conductivity type;
   b) forming a first conductive layer on said first insulating layer;
   c) forming a first silicon dioxide sub-layer on said first conductive layer;
   d) forming a silicon nitride sub-layer on said first silicon dioxide sub-layer;

e) Annealing said silicon nitride sub-layer in a nitrogen and oxygen containing gas;

f) forming a second silicon dioxide sub-layer on said annealed silicon nitride sub-layer;

g) forming a second conductive layer on said second silicon dioxide sub-layer;

h) patterning said first insulating layer, said first conductive layer, said first silicon dioxide sub-layer, said annealed silicon nitride sub-layer, said second silicon dioxide sub-layer, and said second conductive layer to form a floating gate, an intergate dielectric layer, and a control gate; and i) forming a source and a drain.

6. The method of claim 5 wherein said annealed silicon nitride sub-layer is formed by rapid thermal processing said silicon nitride layer in a nitrogen and oxygen containing gas at a temperature in the range between 900° C. and 1100° C.; at a pressure in the range between about 10 kPa and 100 kPa; for a period of time between 20 seconds and 180 seconds.

7. The method of claim 6 wherein said annealed silicon nitride sub-layer is formed by processing said silicon nitride layer in $N_2O$ gas.

8. The method of claim 6 wherein said annealed silicon nitride sub-layer is formed by processing said silicon nitride layer in NO gas.

9. A method of manufacturing a semiconductor memory device comprising the steps of:

a) forming a first insulating layer on a semiconductor substrate having one conductivity type;

b) forming a first conductive layer on said first insulating layer;

c) forming a first silicon dioxide sublayer on said first conductive layer;

d) forming a silicon nitride sub-layer on said first silicon dioxide sub-layer;

e) forming a silicon oxynitride sub-layer by rapid thermal processing said silicon nitride layer in a nitrogen and oxygen containing gas at a temperature in the range between 900° C. and 1100° C.; at a pressure in the range between about 10 kPa and 100 kPa; for a period of time between 20 seconds and 180 seconds;

f) forming a second silicon dioxide sub-layer on said silicon oxynitride sub-layer;

g) forming a second conductive layer on said second silicon dioxide sub-layer;

h) patterning said first insulating layer, said first conductive layer, said first silicon dioxide sub-layer, said annealed silicon nitride sublayer, said second silicon dioxide sub-layer, and said second conductive layer to form a floating gate, an intergate dielectric layer, and a control gate; and i) forming a source and a drain.

10. The method of claim 9 wherein said silicon oxynitride sub-layer is formed to a thickness in the range between 5 Å and 30 Å.

11. The method of claim 9 wherein said annealed silicon nitride sub-layer is formed by processing said silicon nitride layer in $N_2O$ gas.

12. The method of claim 9 wherein said annealed silicon nitride sub-layer is formed by processing said silicon nitride layer in NO gas.

13. The method of claim 1 wherein said silicon oxynitride layer is formed by processing said silicon nitride layer in a rapid thermal process in nitrogen and oxygen containing gas.

14. The method of claim 1 wherein said silicon oxynitride layer is formed by processing said silicon nitride layer in a rapid thermal process in nitrogen and oxygen containing gas and said silicon oxynitride layer has a thickness of between about 5 and 30 Å.

15. A method of manufacturing a semiconductor memory device comprising the steps of:

a) forming a first insulating layer on a semiconductor substrate having one conductivity type;

b) forming a first conductive layer on said first insulating layer;

c) forming a second insulating layer by sequentially stacking:
  (i) a first silicon dioxide layer;
  (ii) a silicon nitride layer;
  (iii) a silicon oxynitride layer; and
  (iv) a second silicon dioxide layer;
  on said first conductive layer;

d) forming a second conductive layer on said second insulating layer; and e) patterning said first insulating layer, said first conductive layer, said second insulating layer, and said second conductive layer to form a floating gate, an integrate dielectric layer, and a control gate;

wherein said silicon oxynitride layer is formed by rapid thermal processing said silicon nitride layer in a nitrogen and oxygen containing gas.

16. The method of claim 15 wherein said silicon oxynitride layer is formed by rapid thermal processing of said silicon nitride layer in a nitrogen and oxygen containing gas and said silicon oxynitride layer has a thickness between 5 Å and 30 Å.

* * * * *